United States Patent
Chi

(10) Patent No.: US 7,804,155 B2
(45) Date of Patent: Sep. 28, 2010

(54) VERTICAL RESISTORS

(75) Inventor: Min-Hwa Chi, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/358,347

(22) Filed: Jan. 23, 2009

(65) Prior Publication Data

US 2009/0160024 A1 Jun. 25, 2009

Related U.S. Application Data

(60) Division of application No. 11/102,340, filed on Apr. 8, 2005, now Pat. No. 7,498,657, which is a continuation-in-part of application No. 10/268,585, filed on Oct. 10, 2002, now abandoned.

(51) Int. Cl.
*H01L 29/66* (2006.01)

(52) U.S. Cl. ............... 257/536; 257/538; 257/E29.166

(58) Field of Classification Search ......... 257/536–543, 257/E29.166

See application file for complete search history.

(56) References Cited

U.S. PATENT DOCUMENTS

| | | | |
|---|---|---|---|
| 4,933,739 A | 6/1990 | Harari | |
| 5,229,710 A * | 7/1993 | Kraus et al. ............ | 323/313 |
| 5,234,861 A | 8/1993 | Roisen et al. | |
| 5,453,953 A | 9/1995 | Dhong et al. | |
| 5,899,724 A | 5/1999 | Dobuzinsky et al. | |
| 6,051,474 A | 4/2000 | Beasom | |
| 6,078,094 A | 6/2000 | Poplevine et al. | |

FOREIGN PATENT DOCUMENTS

WO 0188984 11/2001

OTHER PUBLICATIONS

"Characteristics of CMOS Devise Isolation for the ULSI Age" Brant et al., 1995, IEDM, pp. 671-674.
"Three-Dimensional DIBL for Shallow-Trench Isolated MOSFET" Wang et al., 1999, IEEE Trans. on Electron Devices, vol. 46, No. 1, pp. 139-144.
"The Impact of Isolation Pitch Scaling on Vth Fluctuation in DRAM Cell Transistors due to Neighboring Drain/Source Electric Field Penetration" Sim et al., 1998 IEEE Symp. on VLSI Tech. Digest of Tech. Papers, pp. 32-33.
"Analysis and Design of Analog Integrated Circuits" Gray et al., 1984, Second Edition, Chapter 12, John Wiley & Sons, pp. 702-736.
"High-Performance Cell Transistor Design Using Metallic Shield Embedded Shallow Trench Isolation (MSE-STI) for Gbit Generation DRAM's" J.H. Sim et al., 1999 IEEE Trans. on Electron Devices, vol. 46, No. 6, pp. 1212-1217.

* cited by examiner

*Primary Examiner*—Thinh T Nguyen
(74) *Attorney, Agent, or Firm*—Thomas, Kayden, Horstemeyer & Risley

(57) ABSTRACT

A vertical resistor. A substrate includes a trench filled by an isolation layer. A first doped-type region and a second doped-type region are formed on both sides of the trench. The first doped-type region receives a control bias, the second doped-type region receives a reference bias, and a resistance between the second doped-type region and the substrate is adjusted in response to a voltage difference between the control bias and the reference bias.

18 Claims, 17 Drawing Sheets

VERTICAL RESISTORS

CROSS REFERENCE TO RELATED APPLICATIONS

This application is a division of pending U.S. patent application Ser. No. 11/102,340, filed Apr. 8, 2005 and entitled "VERTICAL RESISTORS AND BAND-GAP VOLTAGE REFERENCE CIRCUITS", which is a Continuation-in-Part of U.S. application Ser. No. 10/268,585, filed Oct. 10, 2002, now abandoned.

BACKGROUND

Shallow-trench isolation (STI) is currently the most popular isolation scheme for advanced CMOS (e.g. 0.25 µm and beyond) due to its superior capability for minimum isolation pitch, better planar surface, and enhanced latch-up immunity. However, as CMOS technology continuously advances to 0.13 µm and beyond, the STI isolation spacing is small (e.g. ~0.1 µm, where $\mu=10^{-6}$) enough for significant field penetration into the transistor channel (or body) area from adjacent poly gates as well as drain/source junctions. As a result of such electrical field penetration, there is a depletion region formed along the channel side-wall of the STI causing transistor narrow width effect and transistor Vt fluctuations. Please refer to the following publications:

Bryant, W. Hnsch, and T. Mii, "Characteristics of CMOS Device Isolation for the ULSI Age", International Electron Device Meetings, p. 671, 1994.

C. Wang, P. Zhang, "Three-Dimensional DIBL for Shallow-Trench Isolation MOSFET's", IEEE Trans. on Electron Device, V. 46, No. 1, p. 139, 1999.

J. H. Sim, J. K. Lee, and K. Kim, "The Impact of Isolation Pitch Scaling on $V_{TH}$ Fluctuation in DRAM Cell Transistors due to Neighboring Drain/Source Electric Field Penetration", Symposium of VLSI technology, p. 32-33, 1992.

In one way to eliminate such field penetration effect, a shielded STI, is proposed by J. H. Sim, j. K. Lee, and K. Kim, in "High-performance cell transistor design using metallic shield embedded shallow trench isolation 9MSE-STI) for Gbit generation DRAM's", IEEE Transaction on Electron Devices, Vol. 46, No. 6, p. 1212-1217, 1999 by filling a layer of conducting material (e.g. doped poly) after liner oxidation of the isolation trench. The grounded conducting material in the trench can provide good shielding and therefore eliminate the transistor narrow-width effect and Vt fluctuations.

As illustrated in FIG. 1 (not to scale), the n-channel body region 15a in p-substrate 12 will have a depletion layer 17 formed along the side-walls of STI 16 as a result of fringe field (as indicated by arrows A) from both poly-gate 19 and adjacent n-doped regions 18 or from adjacent poly gate (not shown), when biased high (e.g. +Vcc). The fringe field from the poly gate edge and n-doped regions (biased high) can expel holes and form depletion layers 17 along the side-wall of STI. Similarly, a corresponding p-channel body region 15b in n-well 14 will also have a depletion layer 17 formed by the fringe field (as indicated by arrows A) from the edge of poly-gate 19 and adjacent p-doped regions 20 as shown in FIG. 2 (not to scale). Similarly, the fringe field from the poly gate edge and p-doped regions (biased low) can expel electrons and form depletion layers along the side-wall of STI. A few parameters of typical 0.13 µm CMOS technology are listed here for reference: STI depth ~0.4 µm, STI minimum width 0.1-0.15 µm, n-doped or p-doped region depth ~0.8-0.12 µm.

STI field penetration effect is considered undesirable in advanced CMOS (especially in DRAM, or SPAM arrays), a metallic-shielded STI was proposed by J. H. Sim, J. K. Lee, and K. Kim in "High-performance cell transistor design using metallic shield embedded shallow trench isolation (MSE-STI) for Gbit generation DRAM's", IEEE Transaction on Electron Devices, Vol. 46, No. 6, p. 1212-1217, 1999, by filling a layer of conducting material (e.g. doped poly) after liner oxidation of the trench. The grounded conducting material in the trench can provide a good shielding and therefore can eliminate Vt fluctuations by the field penetration effect.

A well-known circuit configuration of a voltage reference is described by Gray and Meyer, "Analog VLSI Circuit Analysis", chapter 12, Wiley, 1984, and is illustrated in FIG. 10 using 2 n-MOSFFTs with different threshold voltages of Vt1 and Vt2, referred to as a "$V_T$-difference" voltage reference circuit. The two n-MOSFETs of the same size (i.e. same W/L) are biased by the same magnitude (typically 0.1 µA to 100 µA) current source I, and both n-MOSFETs are used as "pull-up" transistors. The threshold voltage $V_t$ of the two transistors is made different by either channel implant or by a different doping type of the poly gate. The gate of the first n-MOSFET with Vt1 is grounded (as a convenient reference voltage). An operational amplifier (op-amp) OA is connected to the source sides A and B (for detecting the difference of $V_t$) and the op-amp output $V_o$ is connected to the gate of the second n-MOSFET with Vt2 (for maintaining the second n-MOSFET turn-on). The output $V_o$ from the op-amp is simply the v, difference of the two n-MOSFET transistors, i.e. $V_{t1}-V_{t2}$. The accuracy of the circuits depends on the size matching of MOS transistors and the offset of the op-amp. The basic circuit configuration in FIG. 10 can be modified by various additional circuits for trimming or calibration purposes, and is widely used in CMOS VLSI. The temperature coefficient of this circuit can be very good due to the cancellation of temperature dependence of n-MOSFET with different $V_t$. Correspondingly, a reference circuit using two p-MOSFETs can be similarly implemented.

Related U.S. patents pertinent to the invention are:

U.S. Pat. No. 6,078,094 (Poplevine et al.) shows a variable width vertical resist and STI process.

U.S. Pat. No. 6,051,474 (Beasom) teaches a method to bias the isolation trench fill.

U.S. Pat. No. 5,899,724 (Dobuzinsky et al.) describes a TIN vertical resistor. However, this reference differs from the invention.

U.S. Pat. No. 5,234,861 (Roisen et al.) discloses a method to form an isolation structure and to optionally bias it.

U.S. Pat. No. 4,933,739 (Harari) describes a vertical trench resistor.

The undesirable field penetration effect through STI in advanced CMOS can be utilized for a class of new vertical (variable) resistor and FET structures by biasing adjacent junctions for depletion layer or accumulation layer formation in the resistor region along the side-wall of an STI. This new family of devices (vertical resistor and FET) can be formed by CMOS compatible technology.

Also disclosed is a new voltage reference provided by utilizing such vertical FET with n+ and p+ control junctions. The difference in Fermi-levels of n+ and p+ doping (i.e. band-gap) in the control junction is used in the Vt-difference circuit configuration and the output is simply one silicon band-gap. Compared with conventional MOS transistor Vt-difference voltage reference, the proposed voltage reference has smaller layout (due to the vertical nature of FET) with less contact and connections, and smaller temperature coefficient.

SUMMARY

Vertical resistors are provided. An embodiment of a vertical resistor comprises: a substrate comprising a trench; an isolation layer filling the trench; and a first doped-type region and a second doped-type region formed on both sides of the trench, wherein the first doped-type region receives a control bias, the second doped-type region receives a reference bias, and a resistance between the second doped-type region and the substrate is adjusted in response to a voltage difference between the control bias and the reference bias.

An embodiment of a band-gap voltage reference circuit comprises: a substrate comprising a well coupled to a first voltage level, a first trench formed in the well, a second trench formed in the well, and a third trench formed in the well; an isolation layer filling the first trench, the second trench, and the third trench; a first doped region formed adjacent one side of the first trench and coupled to a second voltage level; a second doped region formed between another side of the first trench, and the second trench; a third doped region formed between the second trench and one side of the third trench; a fourth doped region formed adjacent to another side of the third trench; a fifth doped region formed under the first doped region; an amplifier comprising a first input terminal coupled to the second doped region, a second input terminal coupled to the third doped region, and an output terminal coupled to the fourth doped region; a first current source coupled between a third voltage level and the first input terminal; and a second current source coupled between the third voltage level and the second input terminal.

Another embodiment of a band-gap voltage reference circuit comprises: a substrate coupled to a first voltage level, comprising a first trench, a second trench, and a third trench; an isolation layer filling the first trench, the second trench, and the third trench; a first doped region formed adjacent to one side of the first trench and coupled to a second voltage level; a second doped region formed between another side of the first trench, and the second trench; a third doped region formed between the second trench and one side of the third trench; a fourth doped region formed adjacent to another side of the third trench; a fifth doped region formed under the first doped region; an amplifier comprising a first input terminal coupled to the second doped region, a second input terminal coupled to the third doped region, and an output terminal coupled to the fourth doped region; a first current source coupled between a third voltage level and the first input terminal; and a second current source coupled between the third voltage level and the second input terminal.

DESCRIPTION OF THE DRAWINGS

The invention will become more fully understood from the detailed description, given hereinbelow, and the accompanying drawings. The drawings and description are provided for purposes of illustration only and, thus, are not intended to be limiting of the present invention.

FIG. 7b is like FIG. 7a except that the p-doped region in n-base is biased to −Vcc for inducing a (hole) accumulation layer for turn-on.

FIG. 11b is the equivalent circuit of FIG. 11a.

FIG. 12b is the equivalent circuit of FIG. 12a.

FIG. 13b is the equivalent circuit of FIG. 13a.

FIG. 14b is the equivalent circuit of FIG. 14a.

DETAILED DESCRIPTION

Figure 1:
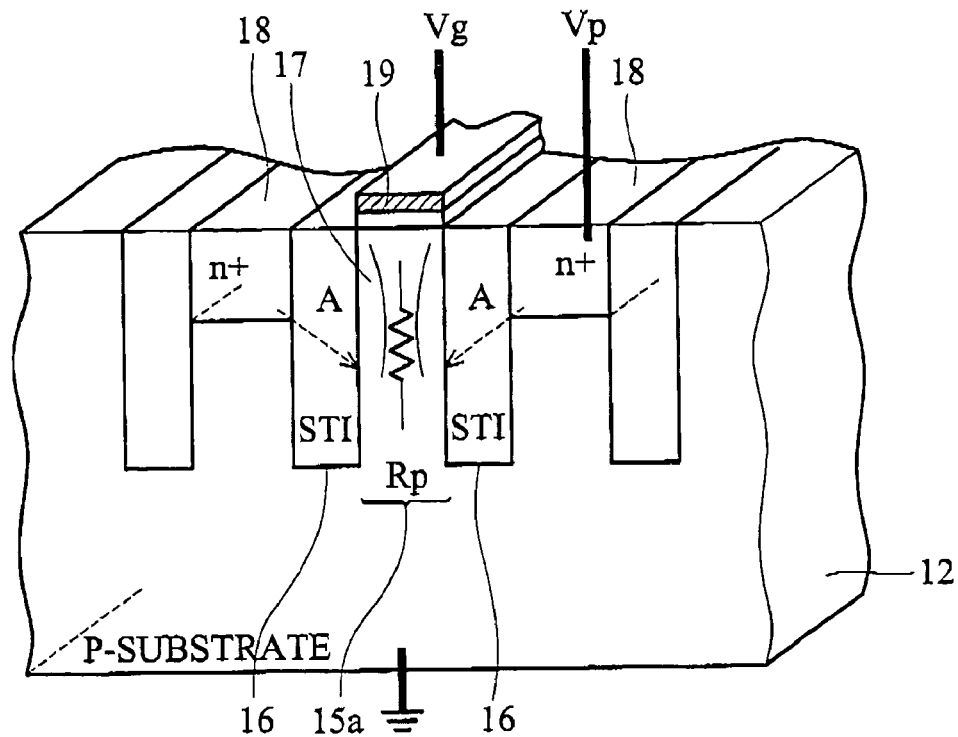
FIG. 1 is a cross-section of an n-channel body region and adjacent n-doped regions (not to scale) in the prior art.
Figure 2:
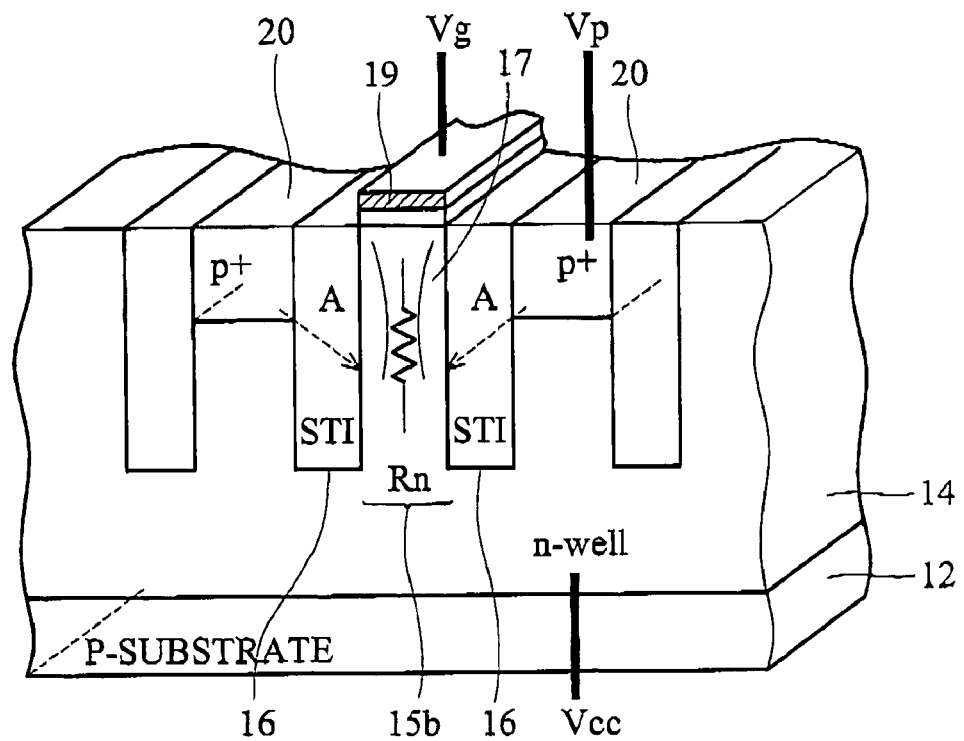
FIG. 2 is a cross-section of a p-channel body region (in n-well) and adjacent p-doped regions (not to scale) in the prior art.
Figure 3A:
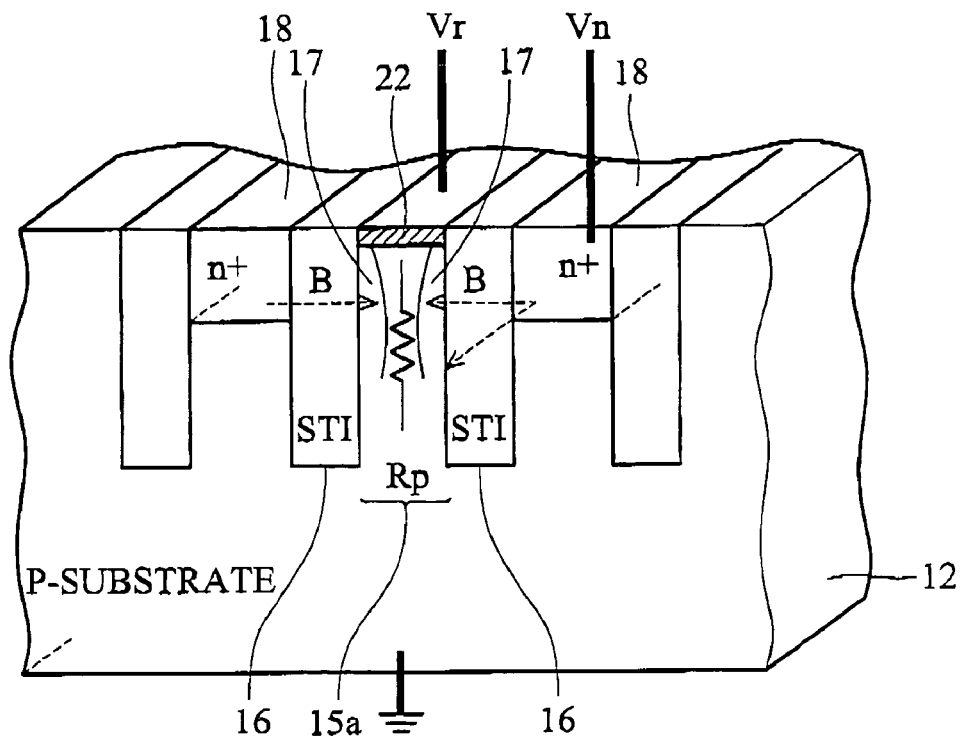
FIGS. 3a and 3b are cross-sections of proposed vertical resistor (p-type and n-type) (not to scale) of the present invention.
Figure 3B:
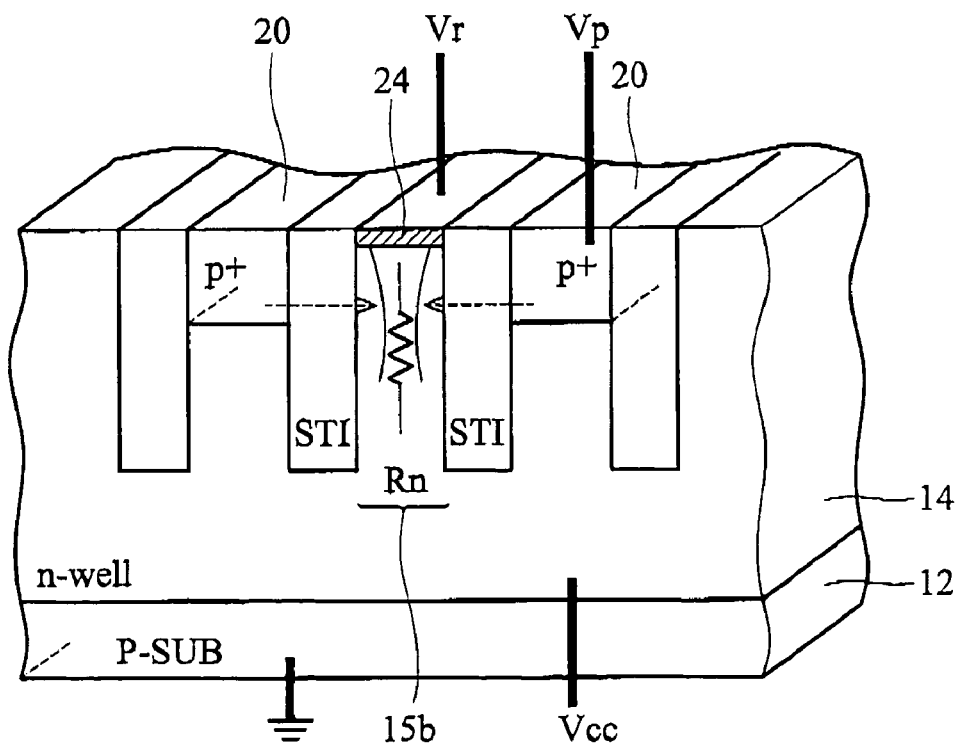

FIGS. 3a and 3b show vertical variable resistors controlled by the field penetration effect from adjacent junctions through the STI structure. The "channel region" in FIG. 1 and FIG. 2 of the prior art has a parasitic resistance, which is also modulated by the depletion layer along a side-wall of STI. Lightly doped drain junctions for resistor contact are formed by the ldd implant steps in typical CMOS technology, e.g. nldd implant for n-MOS and n-type resistor, pldd implant for p-MOS and p-type resistor. The ldd junctions are shallower than source/drain junctions and range from 20 to 100 nm (nm=$10^{-9}$ meter), but preferably range from 20 to 80 nm, so that the field penetration from adjacent junctions can be stronger for forming depletion layers along STI side-wall. The doping of the resistor region is desirably lower, ranging from $1.\text{times}.10^{14}$ to $1.\text{times}.10^{16}$ cm$^3$, so that the depletion layer can be thicker in order for larger range of resistance variations (more discussions on resistor operation later). The adjacent junction simply serves as "control junction" for modulating the vertical resistance by applying biases (i.e. 0 v to Vcc). The usual Co-silicided junctions are not shown in FIGS. 3a and 3b for simplicity. The fabrication of such vertical resistor can be readily implemented (i.e., "it is free") via the typical CMOS technology with proper layout modifications, e.g. blocking n+ or p+ implants to resistor area, blocking Vt or anti-punch-through implants to the resistor area, opening nldd or pldd implants to n or p resistor area, etc.

FIG. 3a is a cross-section of the proposed vertical p-type resistor (not to scale). FIG. 3a shows a p-channel region 15a (the channel region or resistor area) in p-substrate 12. P-channel region 15a is located between one side of STIs 16, and other sides of STIs 16 are adjacent n-doped regions (control junctions) 18. Pldd junction 22 is formed by pldd implant on top of p-channel region 15a flush with the top of p-substrate 12. Field penetration from the adjacent n-doped regions, indicated by arrows B, when biased high (e.g. +Vcc) expels holes and forms a depletion layer 17 along the side-walls of STI 16. Pldd control junction has a depth ranging from 0.1 to 0.5 μm (μm=$10^{-6}$ meter), but not exceeding the depth of the STI structures. The STI structures have a typical depth ranging from 0.3 to 0.5 μm.

FIG. 3b is a cross-section of the proposed vertical n-type resistor (not to scale). The structure is similar to FIG. 3a except that the entire structure is deposited in n-well 14, the adjacent junctions 20 are p-doped regions, the channel region is a p-channel region 15b and that the contact for the channel region is an nldd junction 24 formed by an nldd implant. In addition, the n-well is deposited or, o-substrate 12.

Figure 4:
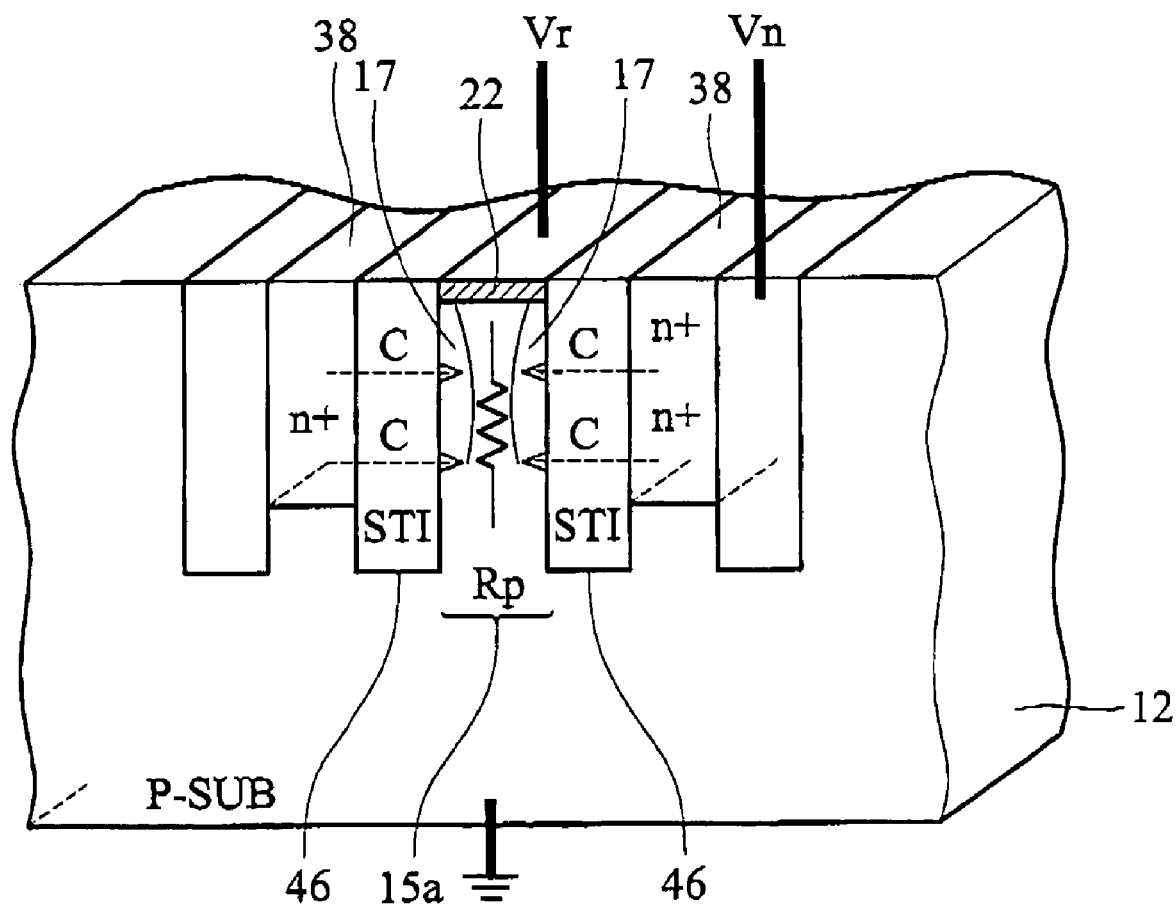
FIG. 4 is a vertical p-type silicon with enhanced field penetration with deeper trench and junctions and separately implanted resistor region for optimum doping level.

FIG. 4 shows an embodiment of a vertical p-type silicon with enhanced field penetration with deeper trench and junctions and separately implanted resistor region for optimum doping level. The STI field penetration effect can be further increased by implementing a few extra process steps as follows and as illustrated in the cross-section of FIG. 4 and when compared with the standard CMOS design of FIG. 3a and FIG. 3b. The adjacent junctions 38 can be deeper (but slightly less than the depth of STI 46) by applying extra masking and implant step. In addition, the doping of the resistor region 15a can be separately implanted for optimizing its dopant concentration. In addition, the adjacent junctions 38 can be either located on one side, or surrounding the resistor region, and the trench 46 can also be deeper (than the usual CMOS STI) by applying extra masking and etching steps. The depth of STI trench 46 in this case ranges from 0.3 to about 2.0 μm but cannot exceed the n-well or deep n-well depth. The typical n-well depth ranges from 1 to 2 μm, and the typical deep n-well depth ranges from 2 to 4 μm in 0.25 CMOS technology. Arrows C illustrate the increased field penetration which implies an increase in the thickness of the depletion layer 17.

The optional n-base and p-base implants will be described later.

Figure 5A:
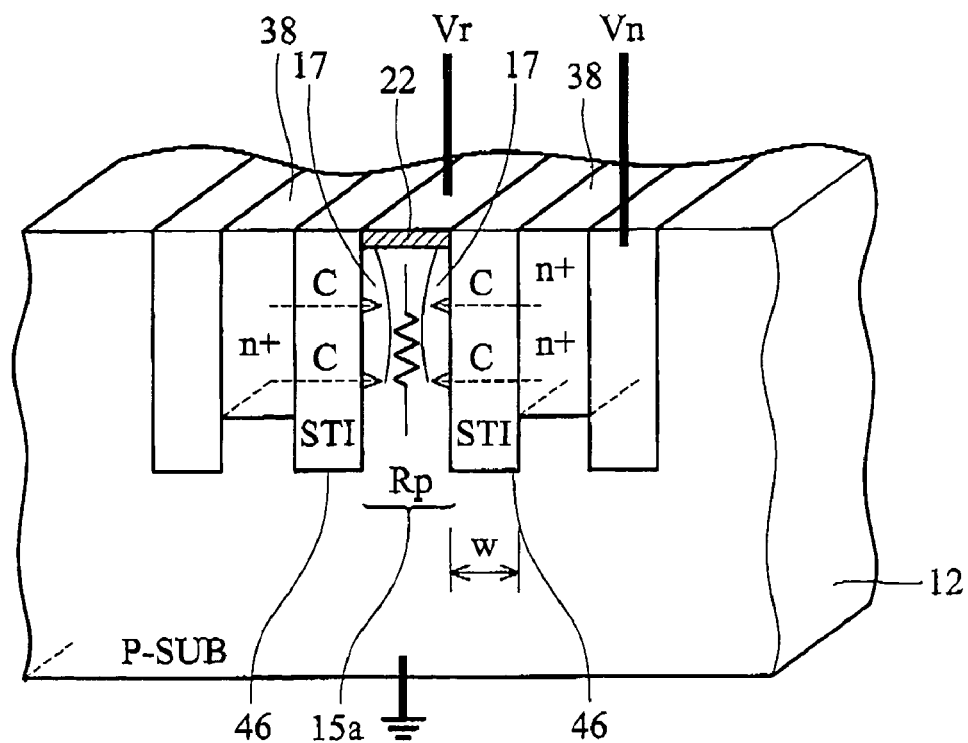
FIGS. 5a and 5b show a simple model with notations for illustration of the doping effect on the vertical resistor.
Figure 5B:
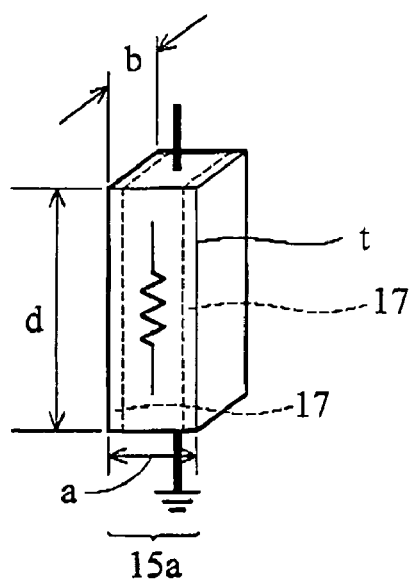

FIGS. 5a and 5b are a simple model of a vertical resistor with notations for illustrating the doping effect on a vertical resistor 15a, where label "ab" represents the resistor cross-section area, label "a" is the minimum active area (OD) width, label "b" is the dimension for the depth of resistor, label "t" is the depletion layer thickness, label "d" is the STI depth, label "w" is the STI spacing (or width of the oxide inside the shallow trench 46). FIG. 5a is a copy of FIG. 4 using the same numerals for the same components.

In FIG. 5, a simple model for the vertical resistor is shown with 2-side depletion layers 17 (i.e., the effective conducting cross-section area of the resistor becomes: (a−2t)·b) by assuming uniform doping in the resistor region and vertical trench profile. The electrical field (on the silicon surface along the STI side-wall) from the n+"control" junction can be estimated by using simple 1D analysis:

$$E_{si} = \epsilon_{ox}(V_n - V_{fb})/(\epsilon_{si} w) \quad (1)$$

where w denotes the STI spacing (or STI oxide thickness viewed from side-wall of vertical silicon region). $V_n$ is the n-doped region bias (e.g. 0 v to $V_{cc}$, with $V_{cc}$ of 3.5 v or 2.5 v typically used on 0.35 μm or 0.25 μm CMOS chip, respectively). The flat-band voltage ($V_{fb}$) of the silicon surface along STI side-wall is about −0.6 v (i.e. mainly the differences in the electron Fermi level differences between the n-doped region and p-silicon region). The relative dielectric constants are $\gamma_{si}$ (~11.9) and $\gamma_{ox}$(~3.9)-. Notice that even if $V_n$ is biased to 0 v, there is already a field on the silicon surface along the side-wall for depleting holes and forming depletion region (due to the built-in field established by the Fermi level difference). Additional $V_n$ will further increase the surface field and increase the thickness of depletion layer. The depletion layer thickness (t) along STI side-wall is then easily calculated by:

$$t = (\epsilon_{si} E_{si})/(q \cdot N_p) = \epsilon_{ox}(V_n - V_{fb})/(w \cdot q \cdot N_p) \quad (2)$$

where, $N_p$ is the p-type doping concentration; q is the electron charge $1.602 \times 10^{-19}$ coulomb. The above expression relates the depletion layer thickness to STI width, n-doped region bias, and p-substrate doping. The resistivity (ρ) of the p-type resistor region is simply:

$$\rho = (N_p g \cdot \mu_h)^{-1} \quad (3)$$

The resistance of the vertical resistor is then related to the effective area (a−2t)·b of cross-section and length (d) (or the depth of trench) of the resistor:

$$R = \rho \cdot d/(b \cdot (a - 2 \cdot t)) \quad (4)$$

where a is the minimum width of active area, and is becomes narrower by the depletion layer. The minimum resistance ($R_{min}$) occurs with Vn biased to 0 v (i.e. smallest depletion layer), and the maximum resistance ($R_{max}$) occurs with $V_n$ biased at $+V_{cc}$. The ratio of $R_{max}/R_{min}$ is of interest as follows:

$$R_{max}/R_{min} = (a - 2t_{min})/(a - 2t_{max}) \quad (5)$$

The critical doping level below which the entire silicon region is depleted can be calculated by setting (a=$2t_{max}$) and using eq. (2).

$$N_{p,min} = 2 \cdot \epsilon_{ox}(V_n - V_{fb})/(a \cdot w \cdot q) \quad (6)$$

Figure 6:
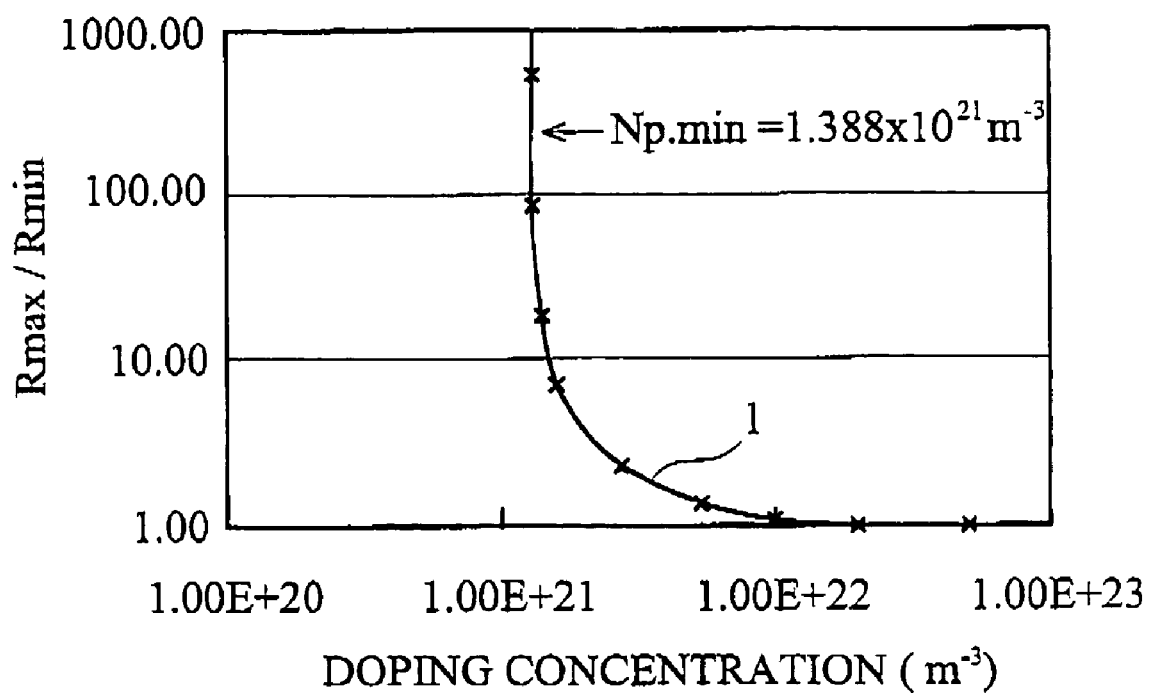
FIG. 6 is a graph of the calculated design curve of the resistor ratio (Rmax/Rmin) vs. doping level.

FIG. 6 shows a calculated design curve 1 of the resistance ratio ($R_{max}/R_{min}$) vs. p-type doping level based on a minimum active width (OD) of a=0.1 μm (μ=$10^{-6}$), an STI spacing of w=0.1 μm, a flat band voltage Vfb of −0.6 v, and Vcc of 2.5 v. The resistor ratio increases rapidly when the doping level decreases below a critical value when the resistor region is fully depleted. In this example in FIG. 6, this critical value of minimum doping concentration of $N_{p \cdot min}$ is ~$1.338 \times 10^{21} m^{-3}$ for a completely depleted resistor. This shows that the doping level of the resistor region is an important process parameter for adjustment to the desirable range of the resistance variation. FIG. 6 also shows that when the doping level is high, the resistance ratio approaches 1. For advanced CMOS (e.g. 0.18 μm and beyond), the channel region has higher doping level for Vt adjustment; therefore the vertical resistor region will be blocked against Vt implant and its doping level is adjusted using a separate implant for optimized doping level. After the desirable resistance ratio is determined, the $R_{min}$ can be set by adjusting the total cross-section area of the vertical resistor using geometry of serpentine or inter-digital stripes with long edges but minimum active area width.

Figure 7A:
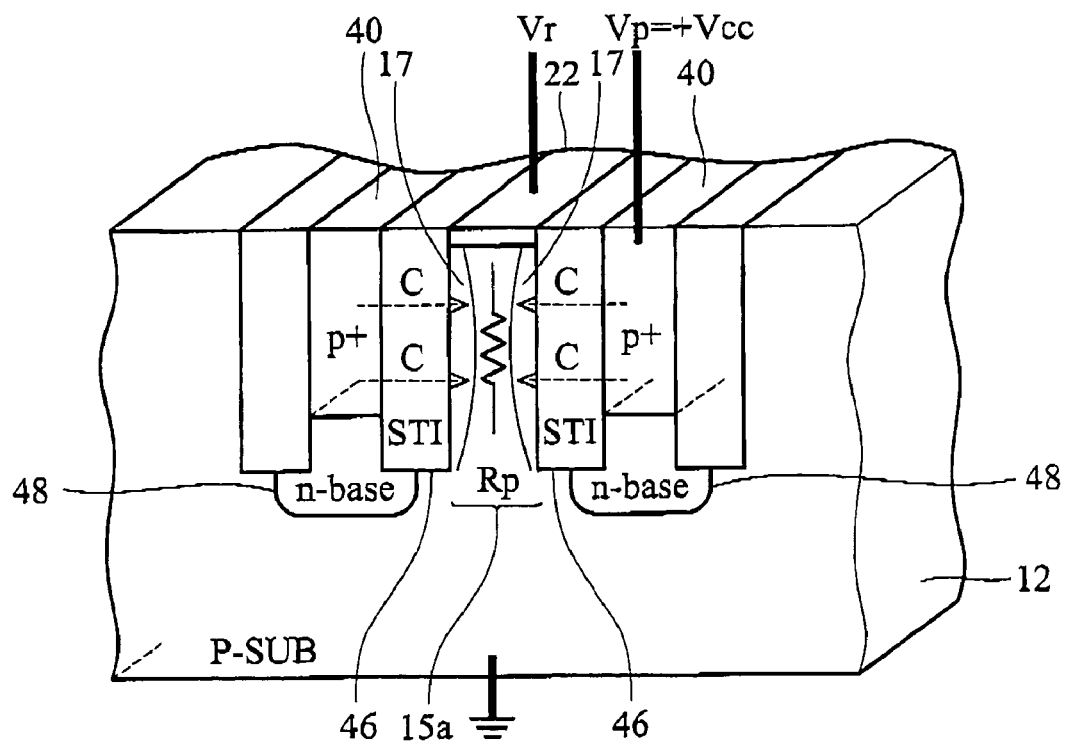
FIG. 7a shows in a sketch how the p-type resistor with the "control junction" as p+ in n-base can serve as a switch or FET. The p-doped region in n-base is biased to +Vcc for inducing a depletion layer for turn-off.
Figure 7B:
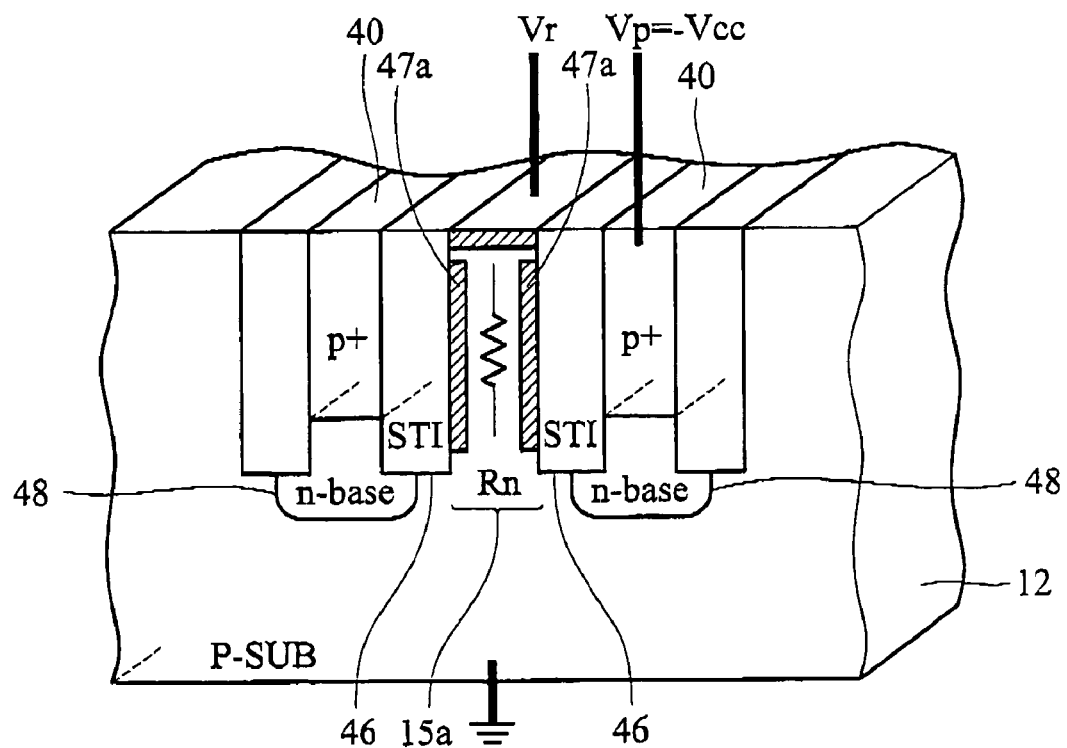

The above described variable resistor may be utilized as a switch or FET if the silicon surface along STI side-wall can be accumulated by the bias from adjacent "control junction" 40 as shown in FIGS. 7a, 7b using a p-type resistor for illustration. The structure of the "control junction 40" is p+ in n-base 48, so that the p-doped region can be biased to either −Vcc (FIG. 7b) or +Vcc (FIG. 7a) to induce a (hole) accumulation 47a or depletion layer 17 on the side-wall of STI 46, respectively. The n-base can be formed at the same time as the deep p-doped region by implants sequentially (e.g., implanting Phosphorus first, then implanting Arsenic). The n-base is left floating and serves as electrical isolation between the p+ "control junction" and the p-substrate 12 below. The accumulation layer 47a provides a conducting channel and therefore results in a low "on" resistance. The depletion layer is designed to fully deplete the silicon area when p+ control junction is biased to +Vcc, for a large "off" resistance. Note that the −Vcc can be generated on-chip by well-known charge-pump techniques.

Figure 8A:
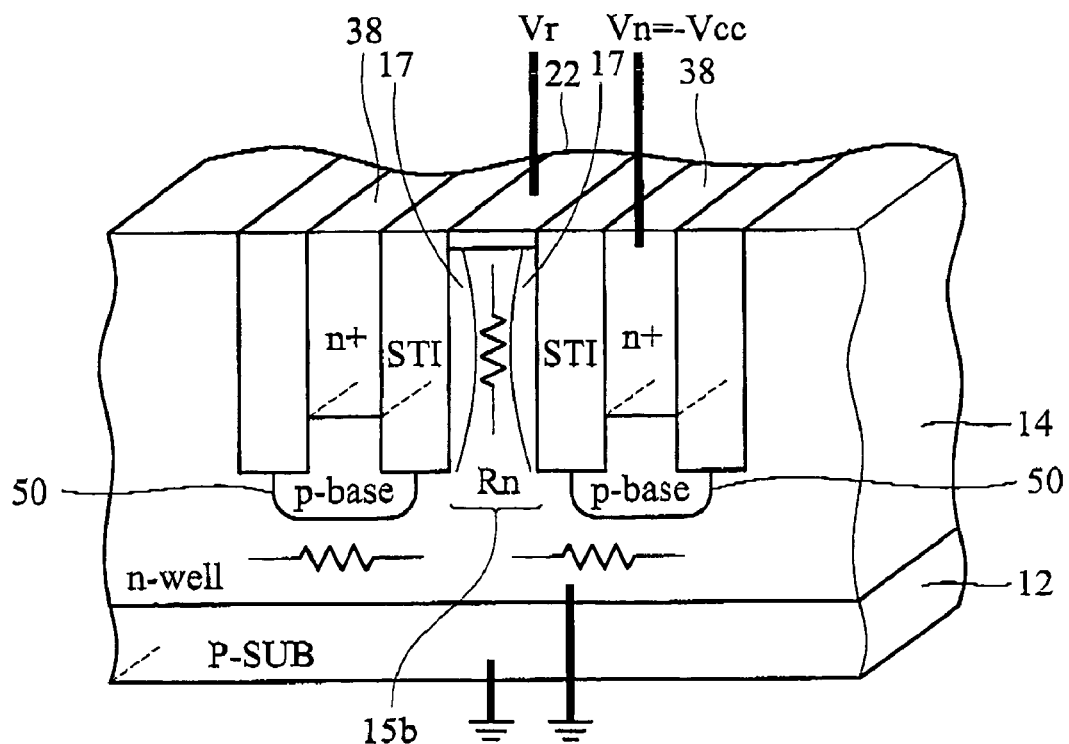
FIG. 8a shows in a sketch how the n-type resistor with the "control junction" as n+ in p-base can serve as a switch or FET. The n-doped region in p-base is biased to −Vcc for inducing a depletion layer for turn-off.
Figure 8B:
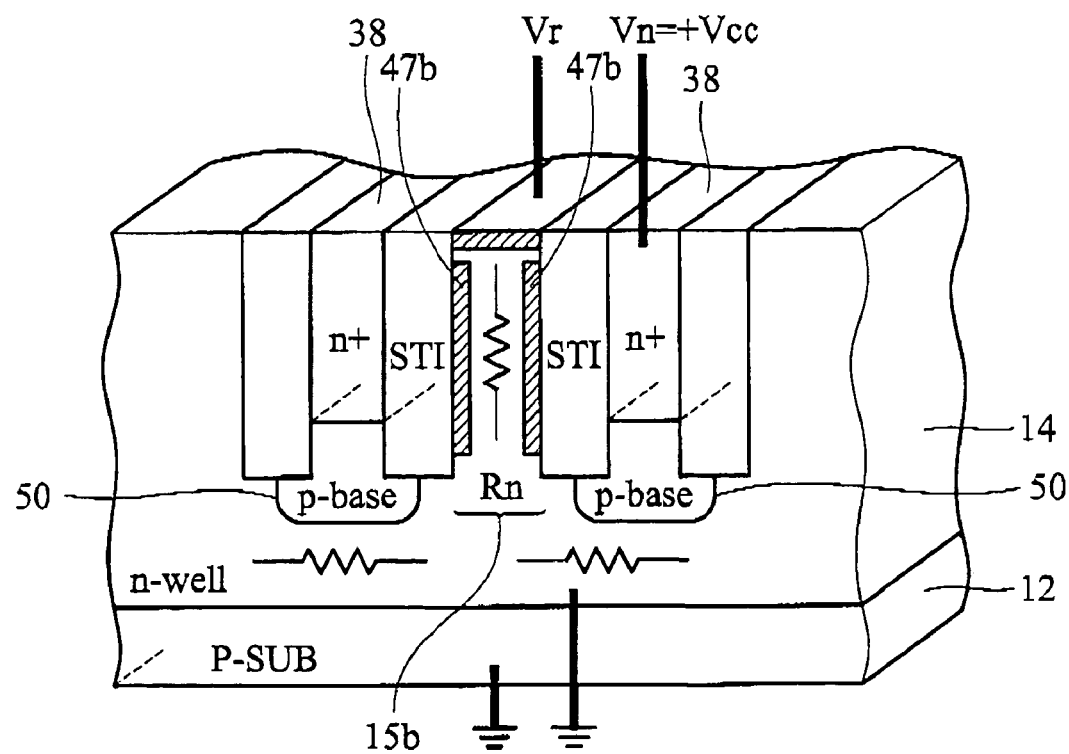
FIG. 8b is like FIG. 8a except that the n-doped region in p-base is biased to +Vcc for inducing an (electron) accumulation layer for turn-off.

This type of vertical resistor, which serves as a switch or FET as controlled by the adjacent junction bias, utilizes the accumulation layer for "turn-on" and the depletion layer for "turn-off". This type of FET with turn-on by accumulation and turn-off by bulk depletion is a unique feature for such vertical switch or FETs. A corresponding a vertical switch or FET, based on n-type resistor, can be similarly formed with n-doped region in p-base as "control junction" as shown in FIGS. 8a, 8b. Still referring to FIGS. 8a, 8b, the n-type resistor 15b with the "control junction 38" as n+ in p-base 50 can serve as a switch or FET. The n-doped region 38 in p-base can be biased to +Vcc (FIG. 8b) and −Vcc (FIG. 8a) to induce an (electron) accumulation layer 47b for turn on and a depletion layer 17 for turn-off, respectively, with p-substrate 12 and n-well 14 biased to typically ground (as a reference). Note that if the n-well is biased to Vcc, n-doped region 38 needs to be biased to 2 Vcc and 0 v for turn-on and turn-off, respectively. Note that a voltage bias higher than the externally supplied Vcc can be generated on-chip by well known charge-pump techniques.

Figure 9A:
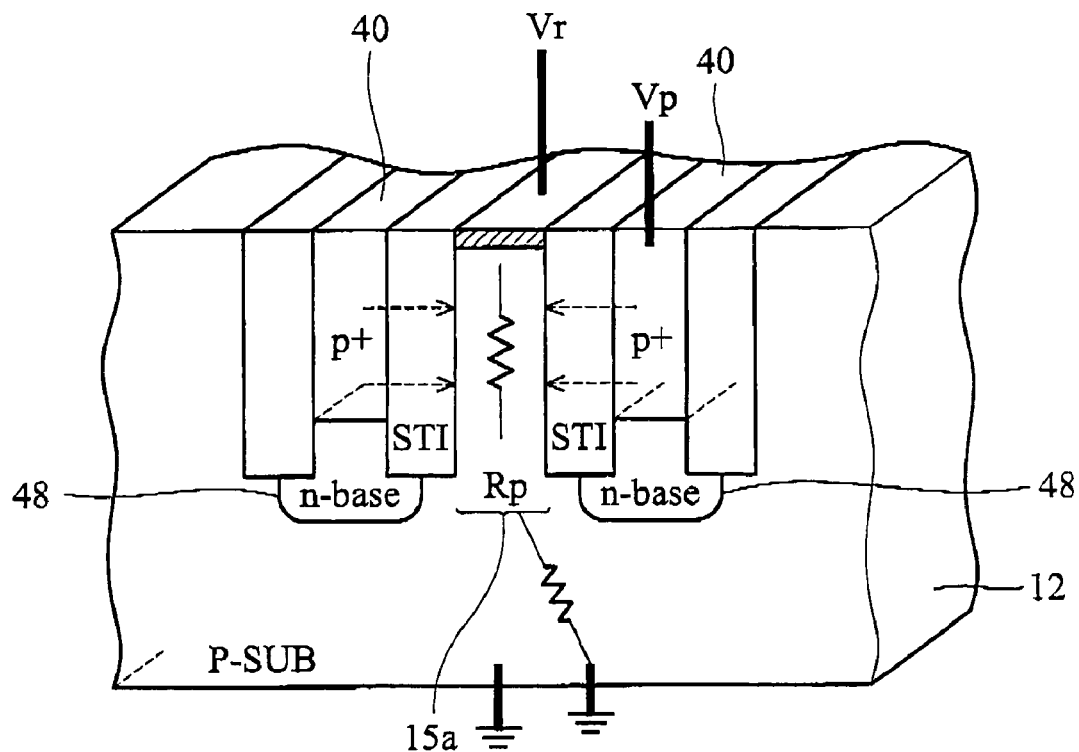
FIGS. 9a and 9b illustrate a general cross-section of a new band-gap voltage reference circuit with two vertical p-FETs and the associated I-V curves, respectively.
Figure 9B:
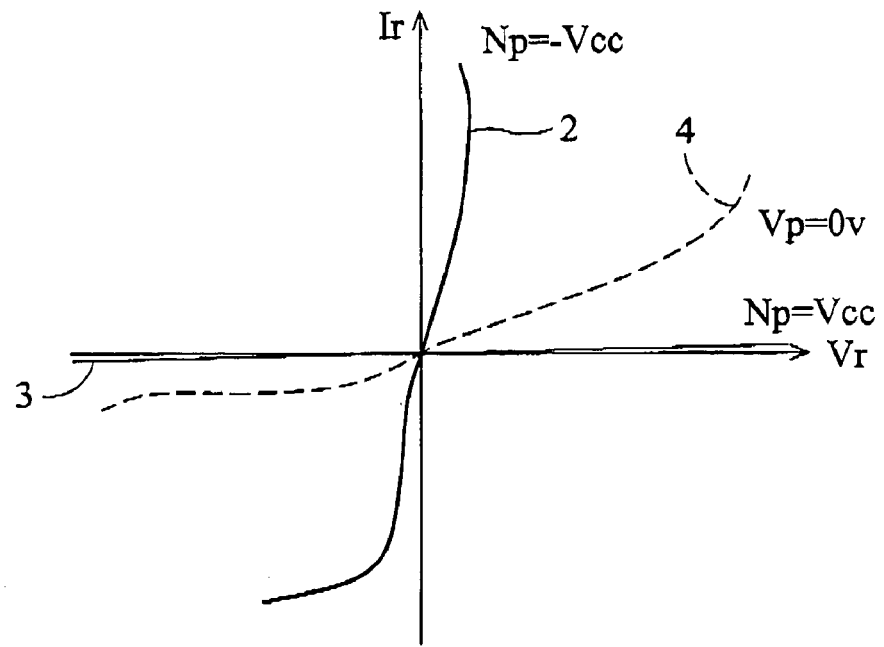

The I-V curve across a vertical p-FET of FIG. 9a is further illustrated in FIG. 9b. When biasing the control-junction (p+/n-base) 40, 48 to −$V_{cc}$, see Curve 2, ne surface of the p-channel 15a is in strong accumulation and a large current ($I_r$) flows through the vertical FET (i.e. on-state) with $V_r$ biased to either positive or negative directions. When biasing the control junction to +$V_r$, see Curve 3, the p-channel is fully depleted and small (leakage) current flows through the device (i.e. off-state) with either positive or negative $V_r$. When the control junction is grounded (i.e. $V_p$=0 v), see Curve 4, the surface is slightly accumulated (due to the Fermi level difference of p+ doping and the p-type doping in channel), and the current ($I_r$) has a "linear region" at smaller values of $V_r$. As the voltage across the FET (i.e. $V_r$) increases toward more positive, $I_r$ increases faster due to heavier accumulation layer induced by the voltage drop across the p-channel and p-substrate 12. Viewed another way, the small-signal resistance (measured from the inverse of the I-V slope) decreases with more positive $V_r$ due to stronger accumulation. As $V_r$ increases in magnitude toward more negative, however, the current $I_r$ increases more slowly or even close to flat (i.e., in "saturation region") due to growing depletion layer induced by the voltage drop across the p-channel and p-substrate. Note that the vertical n-FET will have similar I-V characteristics corresponding to the vertical p-FET, but with reversed polarity of bias.

In an embodiment, to further enhance the field penetration effect, the trench for resistor area may be filled by high dielectric materials (e.g. Ta2O5, Al2O3, or silicon nitride, etc.) instead of silicon oxide by various CVD methods. Certainly, the trench for CMOS area should be filled with lower dielectric constant material (e.g. CVD oxide or FSG, etc.). Therefore, this leads to a need of dual trench scheme, i.e. one deeper trench with high-k material filling (for enhancement of field penetration) on vertical resistor area, and shallower trench with low-k material filling (for isolation) on CMOS areas.

Figure 10:
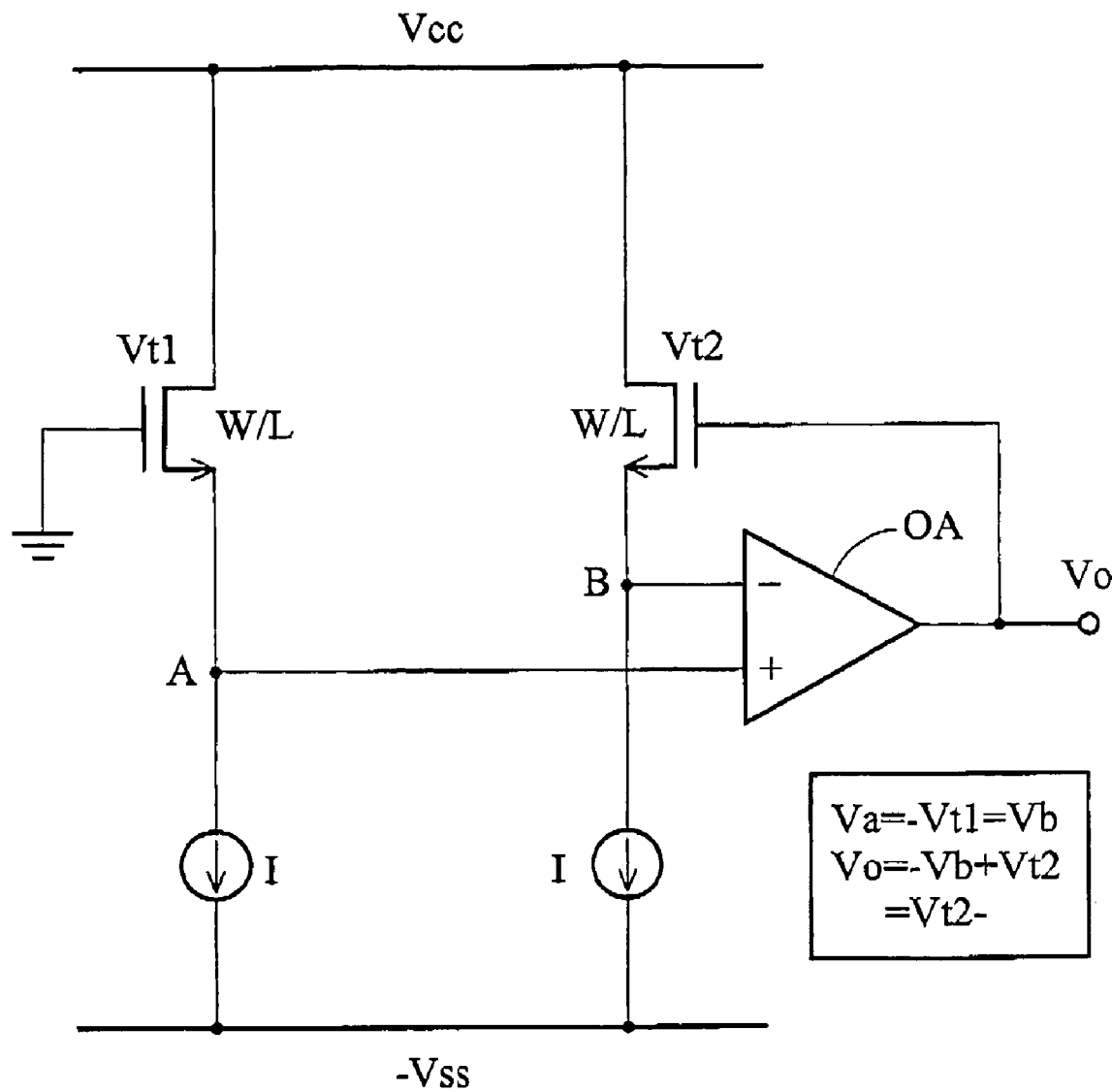
FIG. 10 is a sketch of a basic voltage reference circuit configuration with n-MOS as pull-up transistors of the prior art.
Figure 11A:
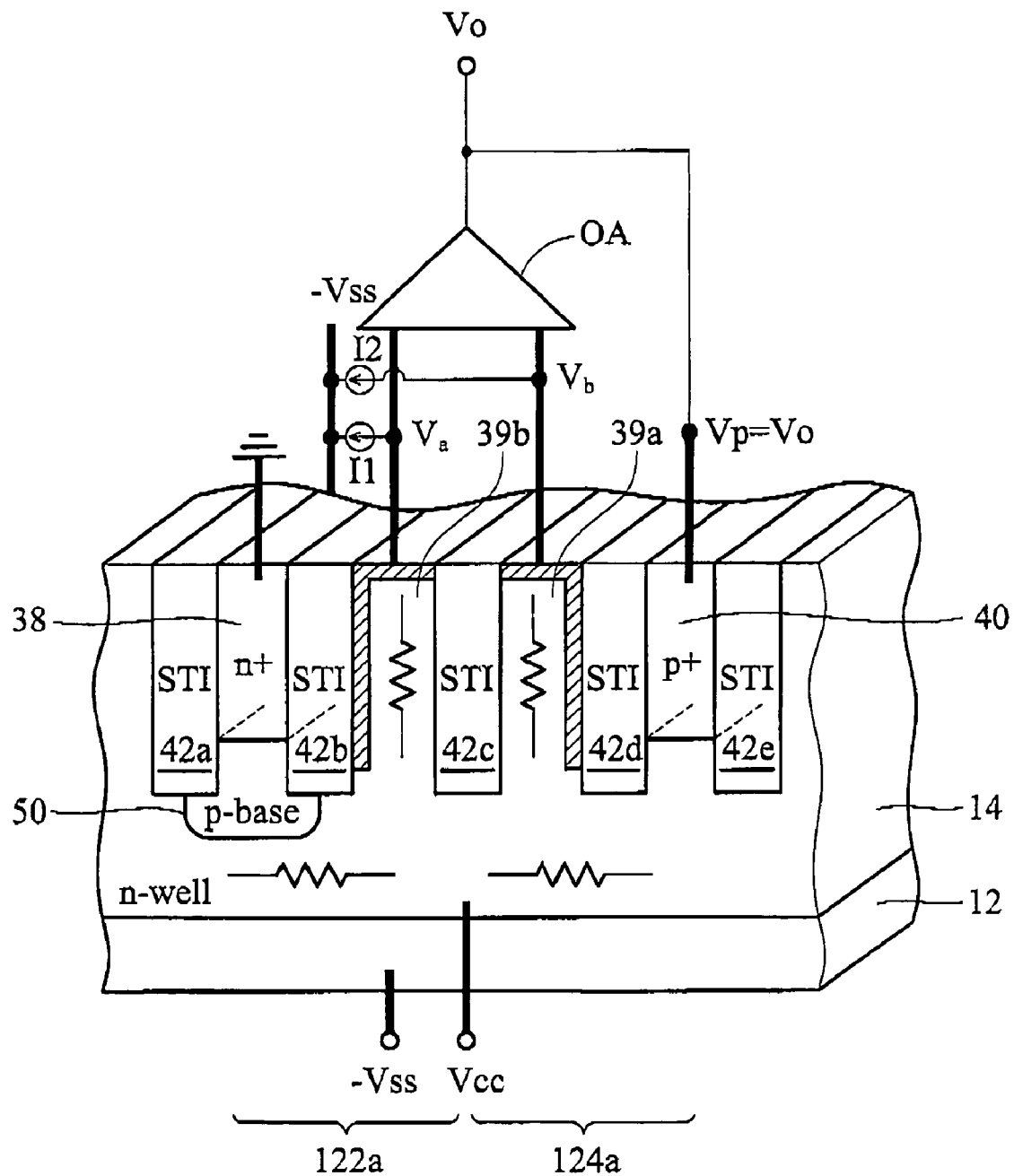
FIG. 11a illustrates a preferred embodiment of the present invention of a new band-gap voltage reference circuit by using two n-channel vertical FETs (in an n-well) with "complementary" control junctions.
Figure 11B:
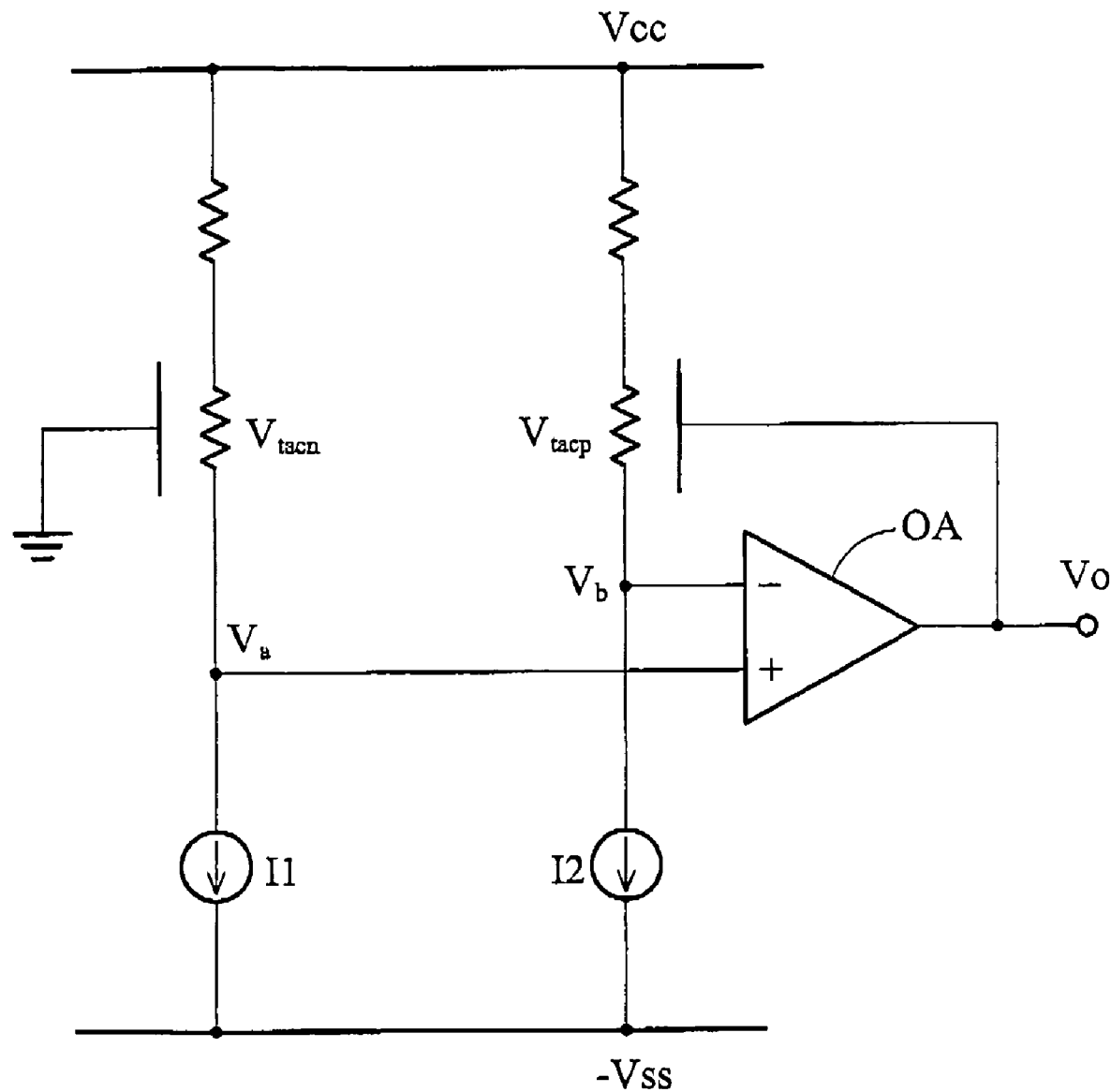

An embodiment of a band-gap voltage reference circuit is based on two vertical n-FETs with n-type and p-type control junctions respectively. The difference in the "threshold voltage" to form an accumulation layer along the vertical side-wall provides a reference voltage close to the silicon band-gap through the $V_t$-difference reference circuit. FIGS. 11a, 11b illustrate such voltage reference circuit using two vertical n-FETs 122a, 124a (as "pull-up" transistor) with "complementary" control junctions (i.e. one a p-doped region 40 and another an n+/p-base junction 38, 50,). The vertical n-FETs are connected to current sources I (e.g. in the range of 0.1 μA to 100 μA) and op-amp OA as shown in FIG. 11a and its equivalent circuit in FIG. 11b (note. same circuit configuration as in FIG. 10). The output voltage is simply the difference in Vt (defined here as the threshold voltage of the control junction for inducing accumulation layer, see the next section for a further detailed definition) of the vertical FETs. Note that both vertical n-FETs operate in the "linear region" (i.e., no need for strong turn-on, thus saving the need for additional charge pumps on chip). P-substrate 12 is tied to −Vss and N-well 14 is tied to Vcc.

In FIG. 11a, p-type substrate 12 is coupled to Vss and comprises a n-well 14 coupled to Vcc, and STI structures 42a-42e formed in the n-well 14. N-type doped region 38 is formed adjacent one side of STI structure 42b and is coupled to ground voltage. N-type doped region 39a is formed between another side of STI structure 42b, and STI structure 42c. N-type doped region 39b is formed between one side of STI structure 42d, and STI structure 42c. P-type doped region 40 is formed between another side of STI structure 42d, and STI structure 42e. P-type doped region (p-base) 50 is formed under n-type doped region 38. Amplifier OA comprises an input terminal Va coupled to n-type doped region 39a, an input terminal Vb coupled to the n-type doped region 39b, and an output terminal coupled to p-type doped region 40. Current source I1 is coupled between −Vss and input terminal Va, and current source I2 is coupled between −Vss and input terminal Vb.

The threshold voltage for forming an accumulation layer (referred to as $V_{tac}$) on a side-wall may be defined as: $V_{tac}=V_{fb}+2Nd$, where $N_n$ is the bulk Fermi level of the n-channel area. Note that $N_n=(kT/q)\cdot\ln(N_d/n_i)$, where k is the Boltzmann constant, T the absolute temperature, q the electron charge, $N_d$ the doping of n-channel area, and $n_i$ is the intrinsic carrier concentration of Silicon. $V_{fb}$ is the flat band voltage viewed from the control junction. It is easily seen that the difference of $V_t$ of accumulation viewed from the p+ control junction and n+ control junction is simply the difference of their flat-band voltage $V_{fb}$, i.e. $V_{tacp}-V_{tacn}=V_{fbp}-V_{fbn}$, which is in turn simply one band-gap $E_g$. Due to the heavy doping of p+ and n+ on the control gate, the $V_{fbp}$ is more positive than $V_{fbn}$ by one full band-gap ($E_g$~1.2 v). Note that if the connection of the two vertical n-FETs to the op-amp inputs is swapped (or equivalently, the polarity of control junctions is swapped), the output will be reversed to −1.2 v.

Figure 12A:
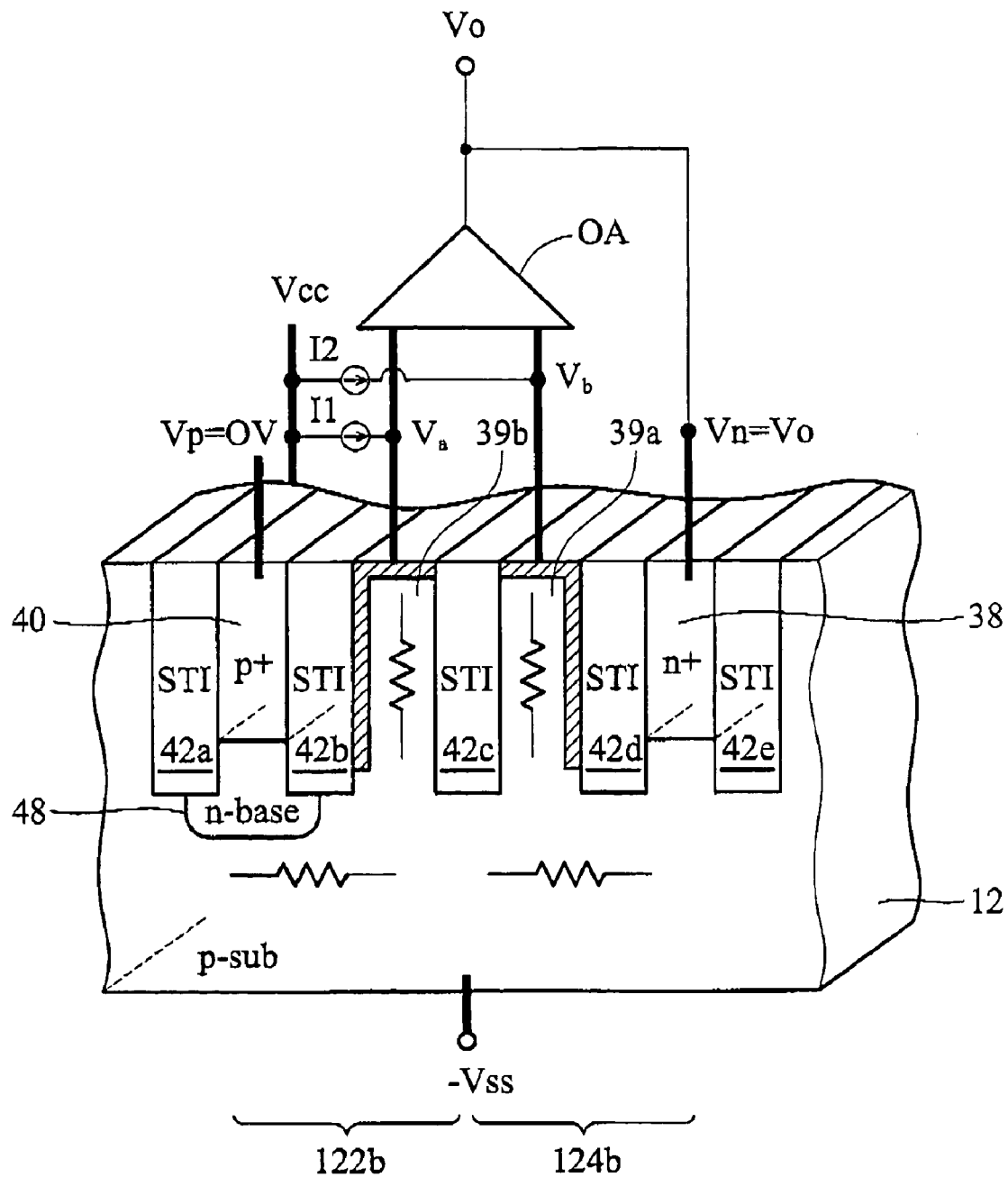
FIG. 12a illustrates a preferred embodiment of the present invention of a new band-gap voltage reference circuit by using two p-channel vertical FETs (in a p-substrate) with "complementary" control junctions.

FIG. 12a shows an embodiment of a band-gap reference using p-FET in linear region. Two p-channel vertical FETs can also be used to form a "band-gap" reference circuit as shown in FIG. 12a and its equivalent circuit in FIG. 12b. Both vertical p-FETs 122b, 124b are used as "pull-down" transistors. Similarly, if the connection of two p-FETs to the op-amp inputs is swapped, then the output will be reversed to +1.2 v. The two p-channel vertical FETs are in p-substrate 12 and have "complementary" control junctions (i.e. one is n-doped region 38, and the other is p-doped region 40, 48).

P-type substrate 12 is coupled to Vss and comprises STI structures 42a-42e. P-type doped region 40 is formed adjacent to one side of STI structure 42b and is coupled to ground voltage Vp. P-type doped region 39a is formed between another side of STI structure 42b, and STI structure 42c. P-type doped region 39b is formed between one side of STI structure 42d, and STI structure 42c. N-type doped region 38 is formed between another side of STI structure 42d, and STI structure 42e. N-type doped region (n-base) 48 is formed under p-type doped region 40. Amplifier OA comprises an input terminal Va coupled to p-type doped region 39a, an input terminal Vb coupled to the p-type doped region 39b, and an output terminal coupled to n-type doped region 38. Current source I1 is coupled between Vcc and input terminal Va, and current source I2 is coupled between Vcc and input terminal Vb.

Figure 12B:
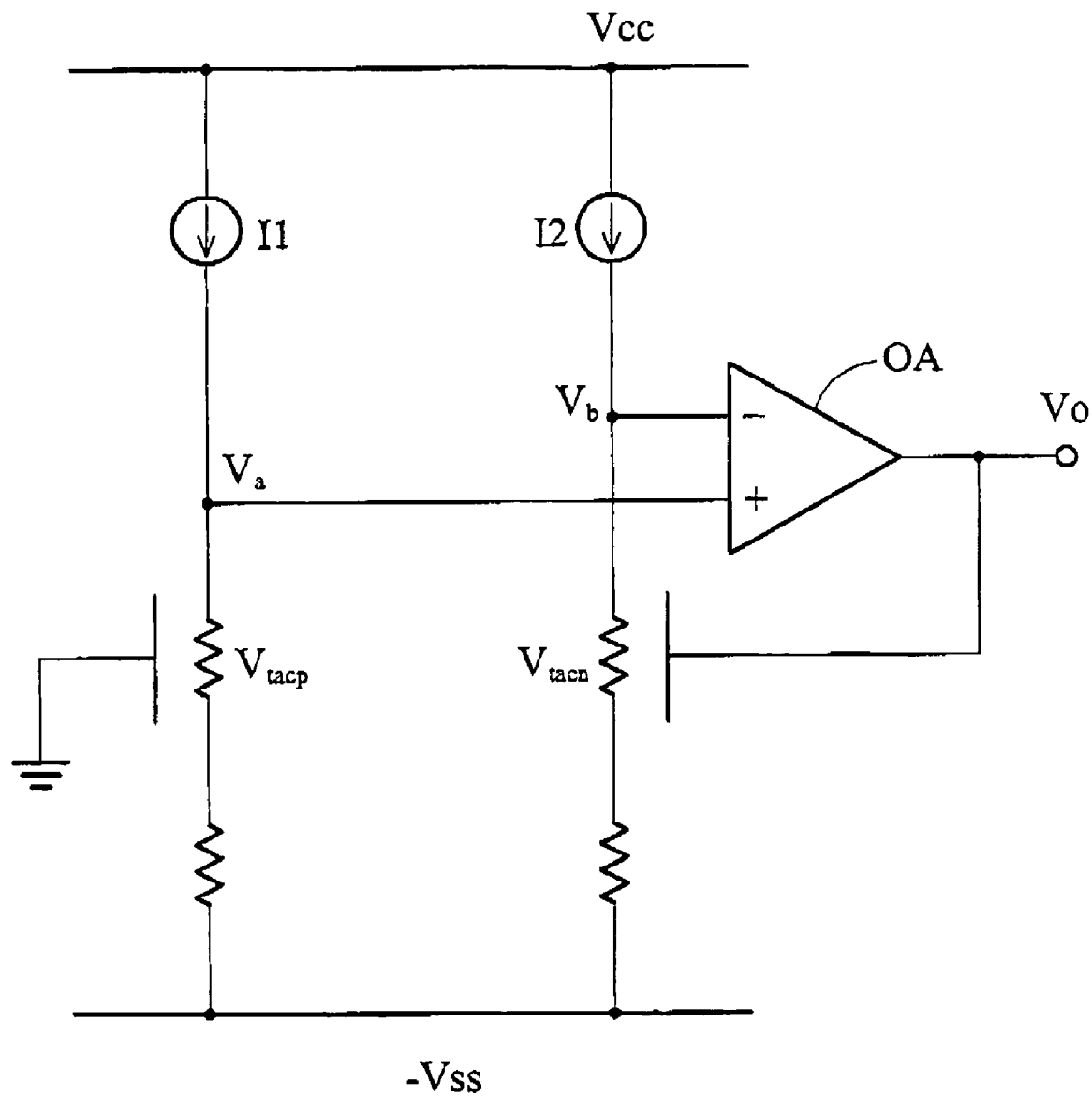

The vertical FETs are connected to current sources I and op-amp OA in FIG. 12a and its equivalent circuit in FIG. 12b. The output voltage Vo is simply the flat-band difference from the n+ and p-doped region and is close to one silicon band-gap (~1.2V).

Figure 13A:
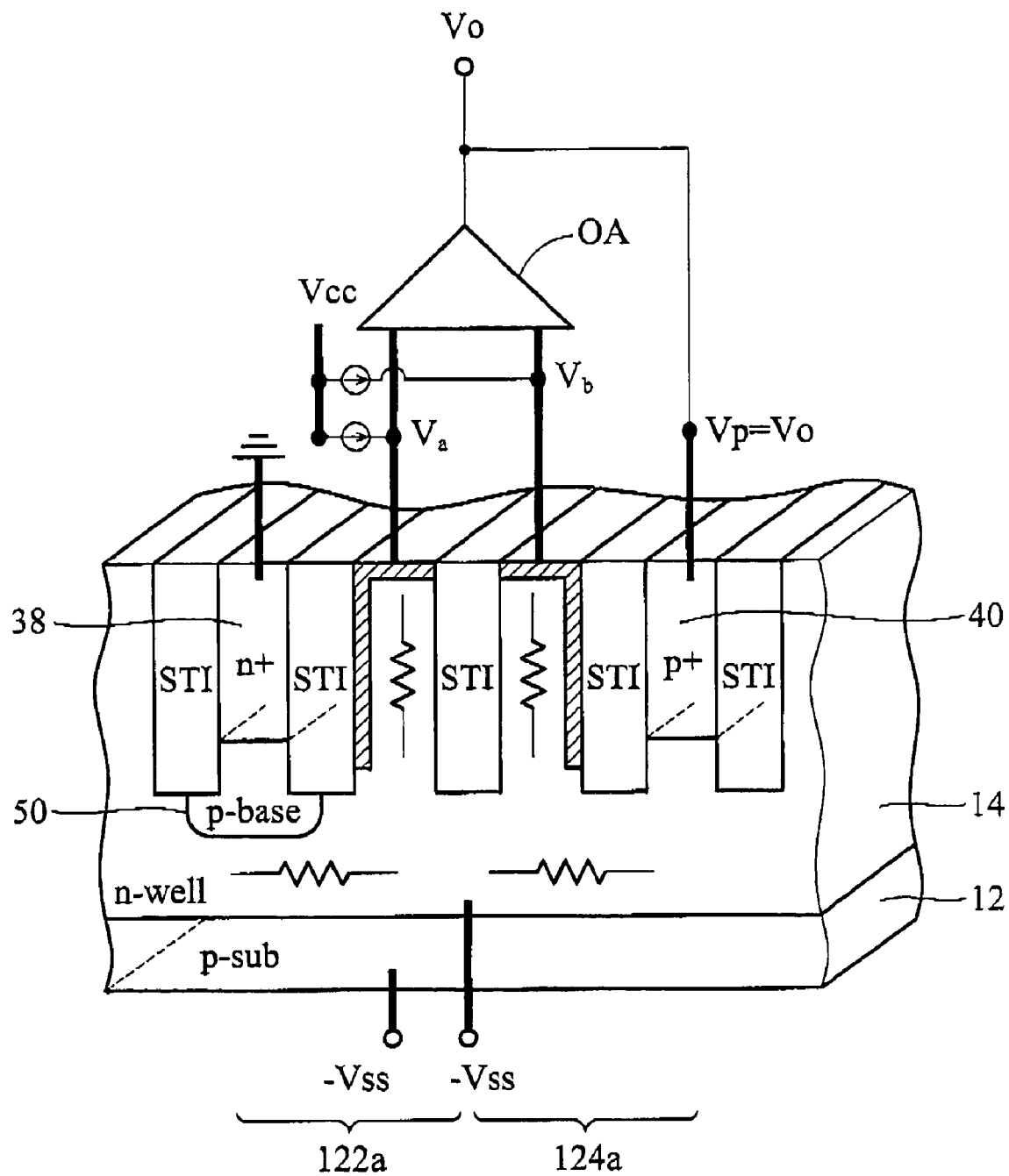
FIG. 13a illustrates that the band-gap reference can also be formed by utilizing two vertical n-FETs in the saturation region.
Figure 13B:
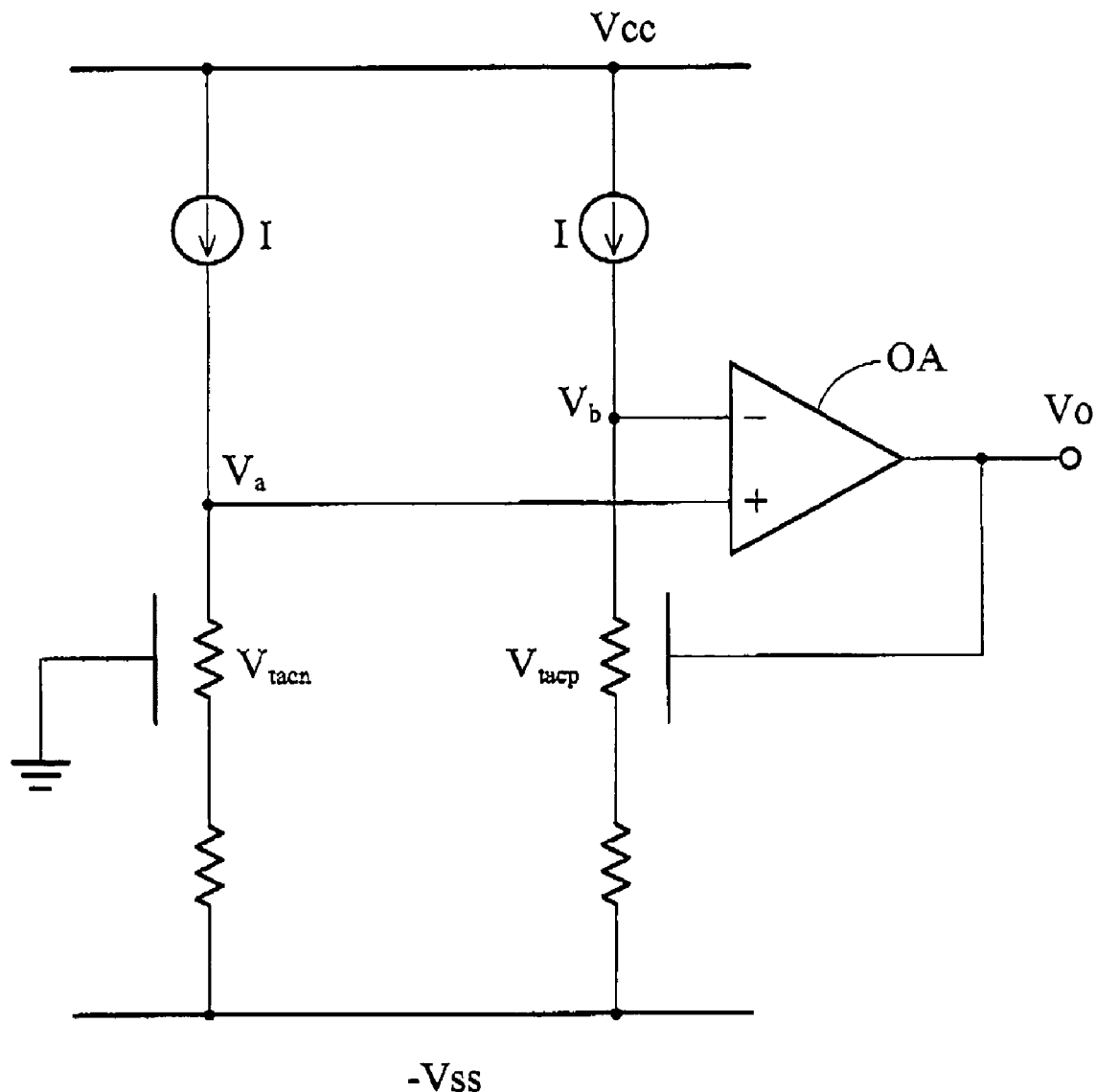

FIG. 13a shows an embodiment of a band-gap reference using vertical n-FETs in saturation region. The band-gap reference can be formed using two vertical n-FETs 122a, 124a operating in saturation as shown in FIG. 13a and its equivalent circuit in FIG. 13b. Note that the n-well 14 is shorted to p-substrate 12 and biased to $-V_{ss}$. Both vertical n-FETs 122a, 124a are used as pull-down devices (as similar to FIG. 12) but with "complementary" control junctions (i.e. one a p-doped region 40 and an n+/p-base junction 38, 50, similar to FIG. 11. Again, when reversing the connections to op-amp OA, a negative $E_g$ will result.

Figure 14A:
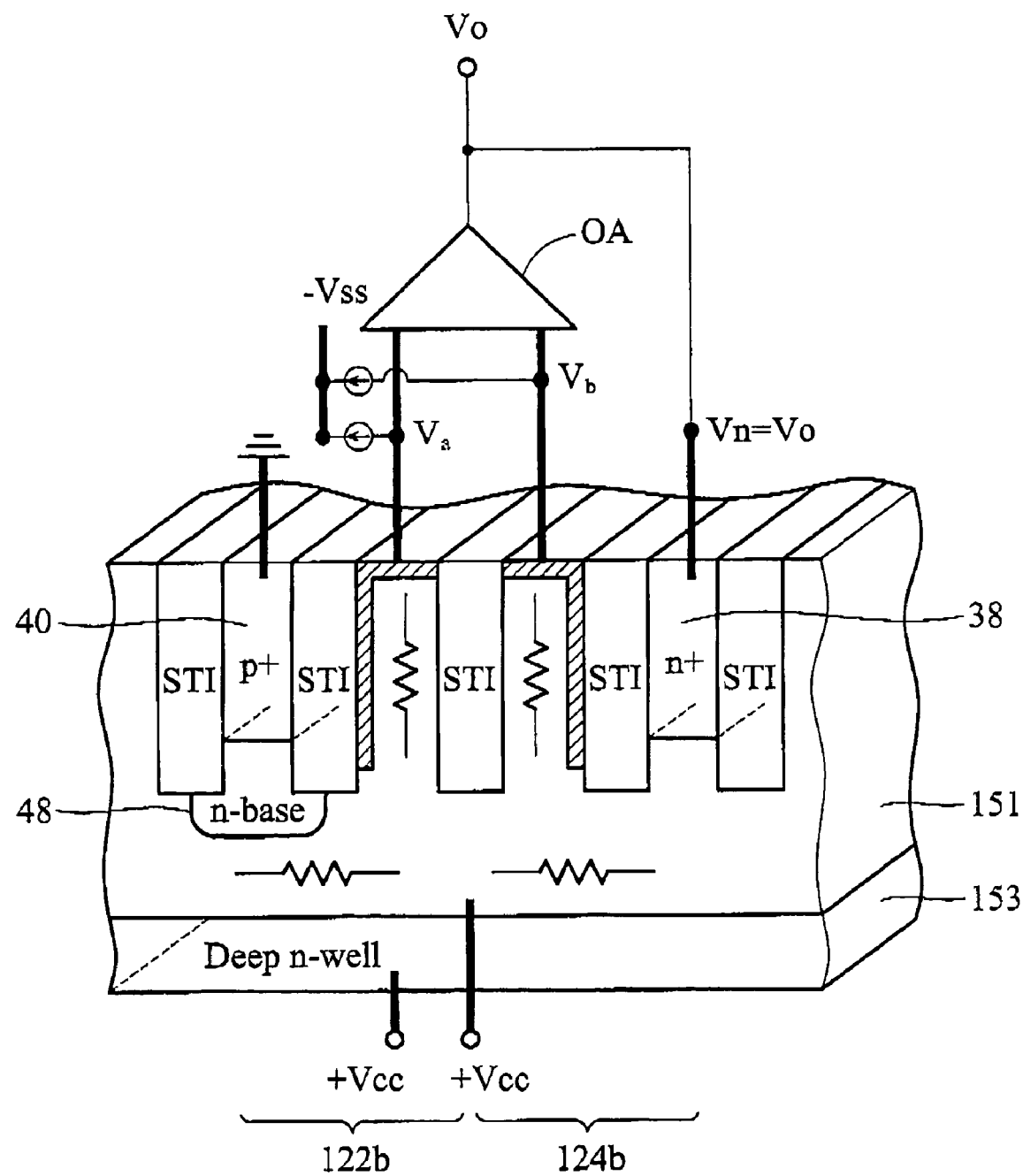
FIG. 14a illustrates that the band-gap reference can also be formed by utilizing two vertical p-FETs in the saturation region.

FIG. 14a shows an embodiment of a band-gap reference using vertical p-FETs in saturation region.

Figure 14B:
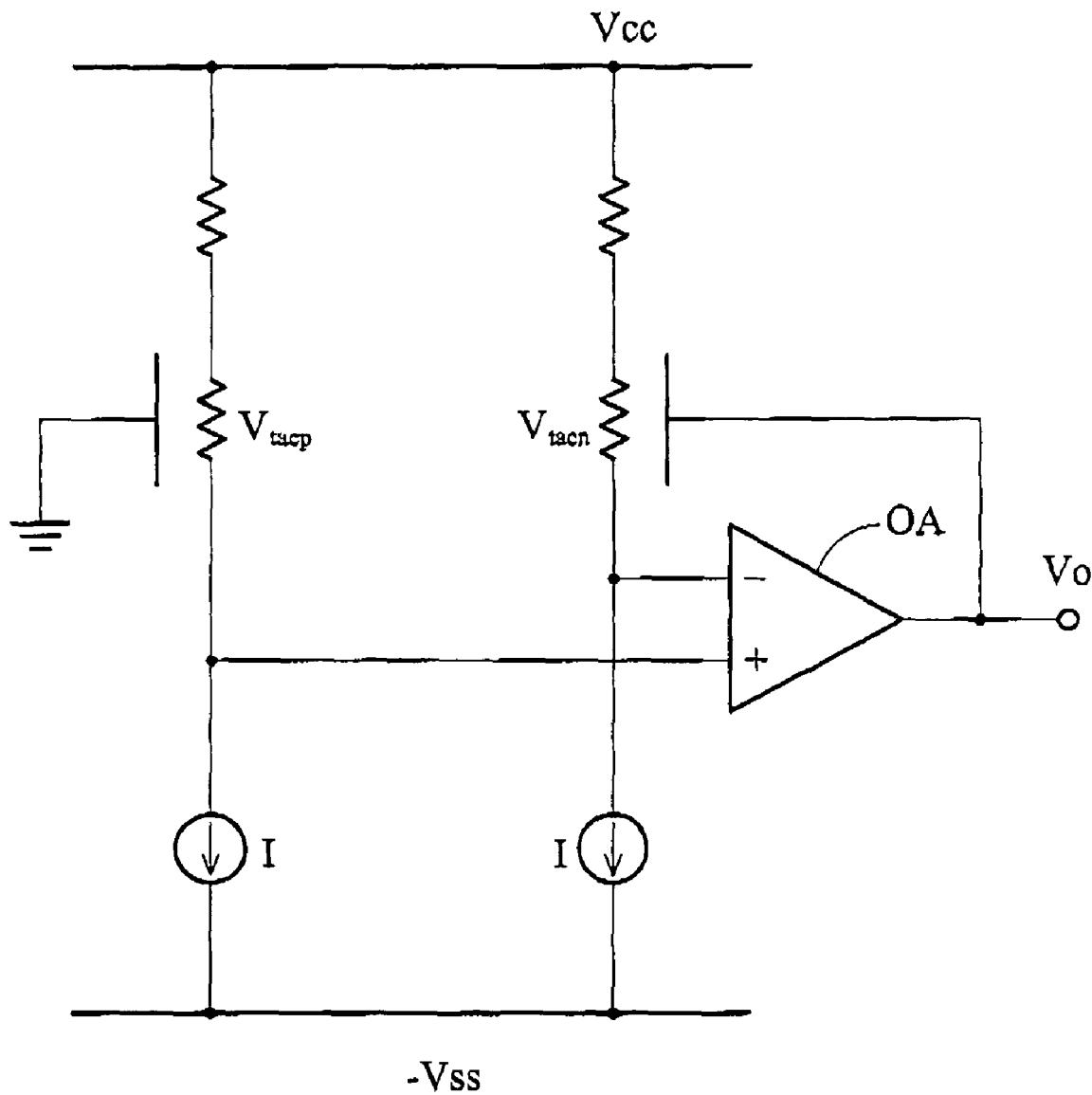

The band-gap reference can also be formed by using two vertical p-FET operating in saturation as shown in FIG. 14a and its equivalent circuit in FIG. 14b. Note that the p-well 151 is fabricated inside deep n-well 153 and that both are shorted to $+V_{cc}$. Both vertical p-FETs 122b, 124b are used as pull-up devices (similar to FIG. 11) but with "complementary" control junctions (i.e. one is n-doped region 38, and the other is p+/n-base junction 40, 48, similar to FIG. 13). Again, when reversing the connection to op-amp OA, a reversed $V_o$ will result.

The foregoing description of several embodiments have been presented for the purpose of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A vertical resistor, comprising:
   a substrate comprising a trench;
   an isolation layer filling the trench;
   a first doped-type region and a second doped-type region formed on both sides of the trench; and
   a lightly doped drain junction formed on the second doped-type region, wherein the first doped-type region receives a control bias, the second doped-type region receives a reference bias through the lightly doped drain junction, and a resistance between the second doped-type region and the substrate is adjusted in response to a voltage difference between the biases from the first doped-type region and the second doped-type region.

2. The vertical resistor as claimed in claim 1, wherein the voltage difference between the control bias and the reference bias forms a depletion region increasing the resistance between the second doped-type region and the substrate.

3. The vertical resistor as claimed in claim 1, wherein the voltage difference between the control bias and the reference bias forms an accumulation region decreasing the resistance between the second doped-type region and the substrate.

4. The vertical resistor as claimed in claim 1, further comprising a third doped-type region under the first doped region.

5. The vertical resistor as claimed in claim 4, wherein the substrate is a p-type substrate, the first doped-type region and the second doped-type region are p-type doped regions, and the third doped-type region is an n-type doped region.

6. The vertical resistor as claimed in claim 1, further comprising a well formed in the substrate, and the trench, the first doped-type region and the second doped-type region are formed in the well.

7. The vertical resistor as claimed in claim 6, wherein the substrate is a p-type substrate, the first doped-type region and the second doped-type region are p-type doped regions, and the well is an n-type well.

8. The vertical resistor as claimed in claim 6, further comprising a third doped-type region under the first doped region.

9. The vertical resistor as claimed in claim 8, wherein the substrate is a p-type substrate, the first doped-type region and the second doped-type region are n-type doped regions, the third doped-type region is a p-type doped region, and the well is an n-type well.

10. The vertical resistor as claimed in claim 1, further comprising a depletion region in the second doped-type region.

11. The vertical resistor as claimed in claim 10, wherein the depletion region is formed along a side-wall of the trench.

12. The vertical resistor as claimed in claim 11, wherein the resistance is adjusted by the depletion layer.

13. The vertical resistor as claimed in claim 1, further comprising an accumulation region in the second doped-type region.

14. The vertical resistor as claimed in claim 13, wherein the accumulation region is formed along a side-wall of the trench.

15. The vertical resistor as claimed in claim 14, wherein the resistance is adjusted by the accumulation layer.

16. A vertical resistor, comprising:
   a substrate comprising a trench;
   an isolation layer filling the trench;
   a first doped-type region and a second doped-type region formed on both sides of the trench; and
   an accumulation region in the second doped-type region, wherein the first doped-type region receives a control bias, the second doped-type region receives a reference bias, and a resistance between the second doped-type region and the substrate is adjusted in response to a voltage difference between the control bias and the reference bias.

17. The vertical resistor as claimed in claim 16, wherein the accumulation region is formed along a side-wall of the trench.

18. The vertical resistor as claimed in claim 17, wherein the resistance is adjusted by the accumulation layer.

* * * * *